United States Patent [19]
Tanizawa

[11] Patent Number: 6,064,278
[45] Date of Patent: May 16, 2000

[54] STRUCTURE OF PULSE-WIDTH MODULATOR

[75] Inventor: Yukihiko Tanizawa, Kariya, Japan

[73] Assignee: Denso Corporation, Kariya, Japan

[21] Appl. No.: 09/181,609

[22] Filed: Oct. 28, 1998

[30] Foreign Application Priority Data

Oct. 28, 1997 [JP] Japan ..................................... 9-295765

[51] Int. Cl.[7] .................................................. H03K 7/08
[52] U.S. Cl. ........................... 332/109; 327/175; 327/176
[58] Field of Search ..................................... 332/109, 110; 327/172, 175, 176

[56] References Cited

U.S. PATENT DOCUMENTS

| | | | |
|---|---|---|---|
| 5,277,497 | 1/1994 | Enomoto | 377/114 |
| 5,481,214 | 1/1996 | Tamaki et al. | 327/172 |
| 5,742,249 | 4/1998 | Hicok et al. | 341/164 |

FOREIGN PATENT DOCUMENTS

| | | |
|---|---|---|
| 53-139968 | 12/1978 | Japan . |
| 56-85932 | 7/1981 | Japan . |
| 57-40361 | 3/1982 | Japan . |
| 6-260908 | 9/1994 | Japan . |
| 7-20953 | 1/1995 | Japan . |
| 7-63125 | 7/1995 | Japan . |

*Primary Examiner*—Siegfried H. Grimm
*Attorney, Agent, or Firm*—Pillsbury Madison & Sutro LLP

[57] ABSTRACT

A compact structure of a pulse-width modulator is provided which includes a clock generator, a counter, a D/A converter, a comparator, and a latching circuit. The clock generator generates clock signals. The counter counts the clock signals and provides a count signal indicative thereof in a digital form. The D/A converter converts the count signal into an analog signal. The comparator compares the analog signal converted by said D/A converter with an input signal to be pulse-width modulated to provide an output indicative thereof. The latching circuit latches the output of the comparator in response to a latch signal shifted from a change in level of the count signal to provide a pulse-width modulated signal.

6 Claims, 8 Drawing Sheets

STRUCTURE OF PULSE-WIDTH MODULATOR

BACKGROUND OF THE INVENTION

1. Technical Field of the Invention

The present invention relates generally to an improved structure of a pulse-width modulator suitable for integration and a sensing device using the same.

2. Background of Related Art

The present-day automotive vehicles usually use a number of pressure sensors which output analog signals. A control computer into which the outputs of the pressure sensors are inputted thus needs an A/D converter, thereby resulting in an increase in port in the control computer.

As an alternative to the A/D converter, a pulse-width modulator may be employed which converts the output of the sensor into a pulse width-modulated (PWM) signal. The control computer calculates the pulse width of the sensor output using a counter to determine a parameter sensed by the sensor.

In recent years, semiconductor pressure sensors are being decreased in number of component parts for decreasing manufacturing costs and becoming prevalent in compact structure in which sensing elements such as strain gauges and a signal processing circuit are integrated. This, therefore, requires integration of the pulse-width modulator.

SUMMARY OF THE INVENTION

It is therefore a principal object of the present invention to avoid the disadvantages of the prior art.

It is another object of the present invention to provide an improved structure of a pulse-width modulator suitable for integration.

It is a further object of the invention to provide a compact structure of a sensing device using a pulse-width modulator.

According to one aspect of the present invention, there is provided a pulse-width modulator which comprises: (a) a clock generator generating clock signals; (b) a counter counting the clock signals outputted from the clock generator to provide a count signal indicative thereof in a digital form; (c) a D/A converter converting the count signal provided by the counter into an analog signal; (d) a comparator comparing the analog signal converted by the D/A converter with an input signal to be pulse-width modulated to provide an output indicative thereof; and (e) a latching circuit latching the output of the comparator in response to a latch signal shifted from a change in level of the count signal outputted from the counter to provide a pulse-width modulated signal.

In the preferred mode of the invention, the clock generator includes an oscillator outputting an oscillating signal and a circuit outputting the clock signals and the latch signal based on the oscillating signal.

The latching circuit includes a flip-flop with a synchronous input which is set by a signal inputted in a given cycle and reset by latching the output of the comparator in response to the latch signal.

According to another aspect of the present invention, there is provided a sensing device which comprises: (a) a sensing circuit sensing a given parameter to output a sensor signal indicative thereof; (b) a clock generator generating clock signals; (c) a counter counting the clock signals outputted from the clock generator to provide a count signal indicative thereof in a digital form; (d) a D/A converter converting the count signal provided by the counter into an analog signal; (e) a comparator comparing the analog signal converted by the D/A converter with the sensor signal outputted from the sensing circuit to provide an output indicative thereof; and (f) a latching circuit latching the output of the comparator in response to a latch signal shifted from a change in level of the count signal outputted from the counter to provide a pulse-width modulated signal.

In the preferred mode of the invention, the sensing circuit, the clock generator, the counter, the D/A converter, the comparator, and the latching circuit are integrated into one chip.

A circuit is further provided which adjusts a pulse width of the pulse width-modulated signal outputted from the latching circuit to be within a range of a minimum and a maximum value corresponding to a given range within which the sensor signal changes.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIG. 2($b$) shows a waveform of a least significant bit in a counter 22;

FIG. 2($c$) shows a waveform of an output of a D/A converter 23;

FIG. 2($d$) shows a waveform of an output of a comparator 24;

FIG. 2($e$) shows a waveform of a clock pulse CLK' generated by a clock generator 21;

FIG. 2($f$) shows an output of an RS flip-flop;

FIGS. 4($b$) and 4($c$) show waveforms of outputs from Q and $\overline{Q}$ of a T flip-flop 212$a$;

FIGS. 4($d$) and 4($e$) show waveforms of outputs from Q and $\overline{Q}$ of a T flip-flop 212$b$;

FIGS. 4($f$) and 4($g$) show waveforms of outputs from Q and $\overline{Q}$ of a T flip-flop 212$c$;

FIG. 4($h$) shows a waveform of a clock pulse CLK' generated by a clock generating circuit 213;

FIG. 6($b$) shows a waveform of an output of a comparator 24;

FIG. 8($b$) is a vertical sectional view of FIG. 8($a$);

DESCRIPTION OF THE PREFERRED EMBODIMENT

Figure 1:
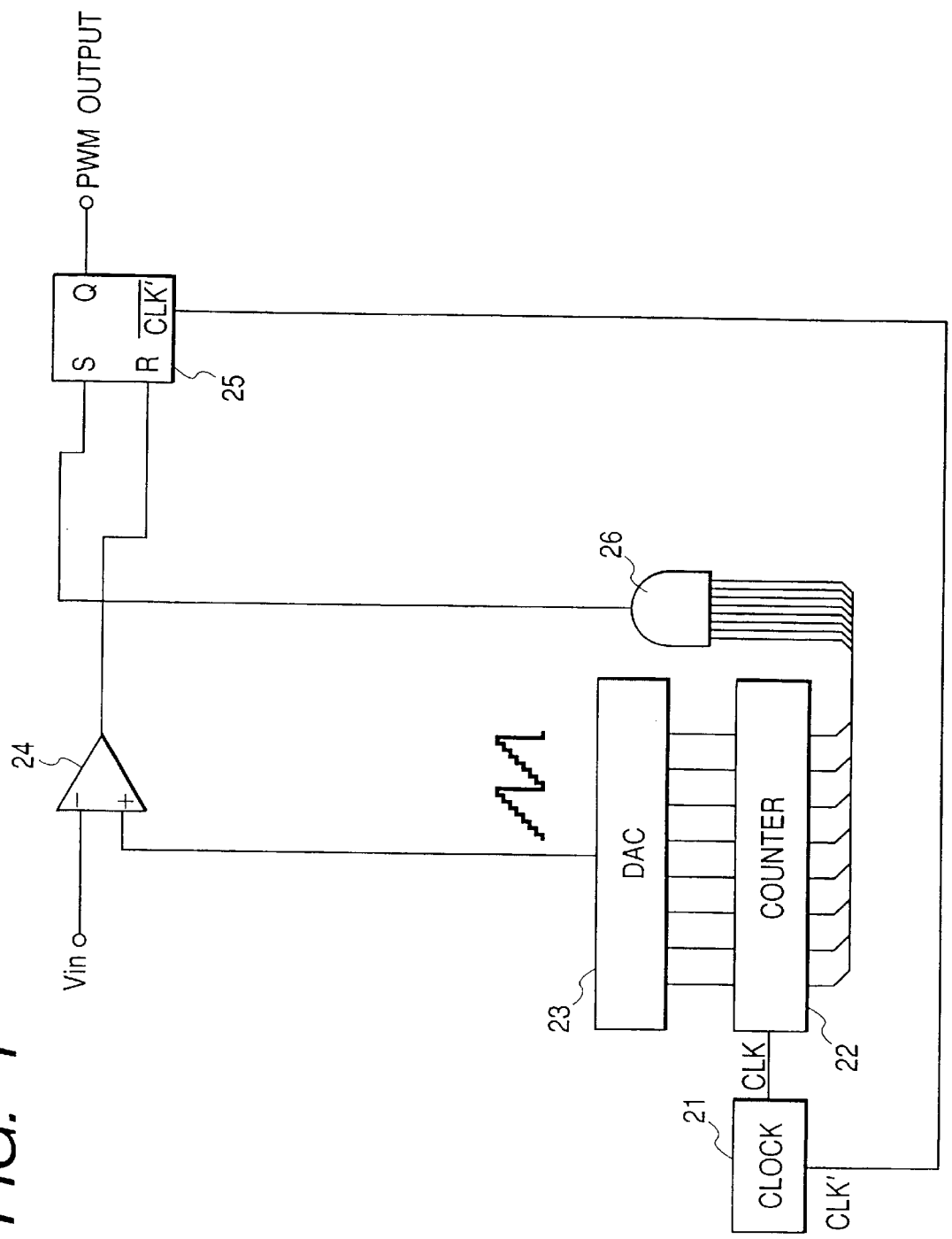
FIG. 1 is a block diagram which shows a pulse-width modulator according to the present invention.

Referring now to the drawings, particularly to FIG. 1, there is shown a pulse-width modulator according to the present invention which includes generally a clock generator 21, a counter 22, a D/A converter 23, a comparator 24, an RS flip-flop 25 with a synchronous input, and an AND gate 26.

Figure 2:
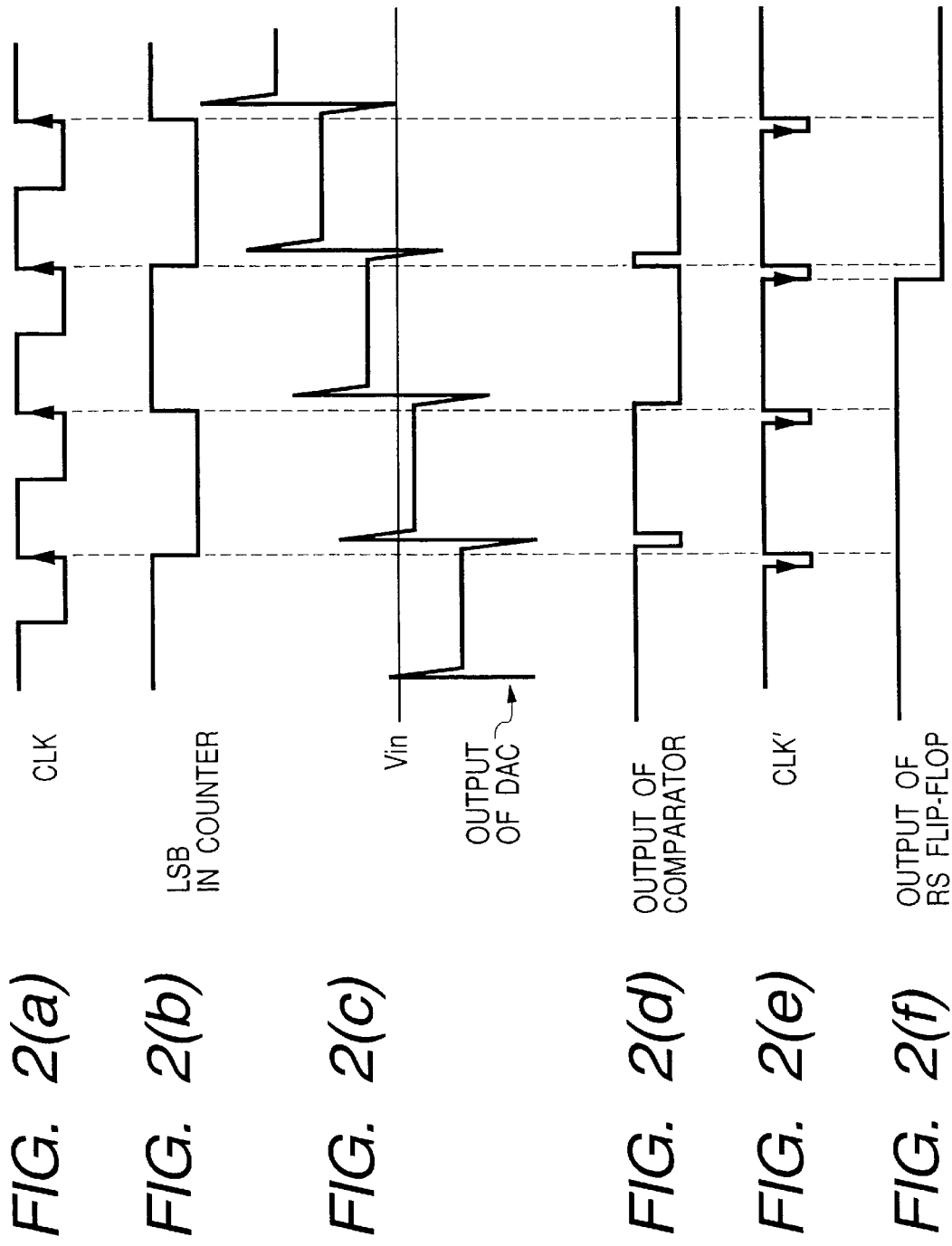
FIG. 2($a$) shows a waveform of a clock pulse CLK generated by a clock generator 21.

The clock generator 21 outputs, as shown in FIGS. 2(a) and 2(e), clock pulses CLK and clock pulses CLK'. Each of the clock pulses CLK' is shifted in trailing edge from one of the clock pluses CLK. The counter 22 counts the clock pulses CLK. The D/A converter 23 converts a digital signal representing a count value of the counter 22 into an analog signal which changes, as shown in FIG. 1, in voltage in a stepwise fashion.

The comparator 24 compares a voltage signal inputted from the D/A converter 23 with an input voltage Vin and outputs a reset signal of a high level when the voltage signal from the D/A converter 23 exceeds the input signal Vin.

The AND gate 26 serves as a decoder for detection of completion of each counting cycle which outputs a set signal to the RS flip-flop 25 every time the counter 22 reaches a maximum count value.

The RS flip-flop 25 is set and reset in response to the set and reset signals from the comparator 24 and the AND gate 26 at the time when the clock pulse CLK' (i.e. a latch signal) outputted from the clock generator 21 falls. Specifically, the RS flip-flop 25 is set cyclically in response to the set signal from the AND gate 26 and reset with timing depending upon the input signal Vin, thereby outputting PWM signals having the pulse width or duty cycle determined by the input voltage Vin.

Figure 3:
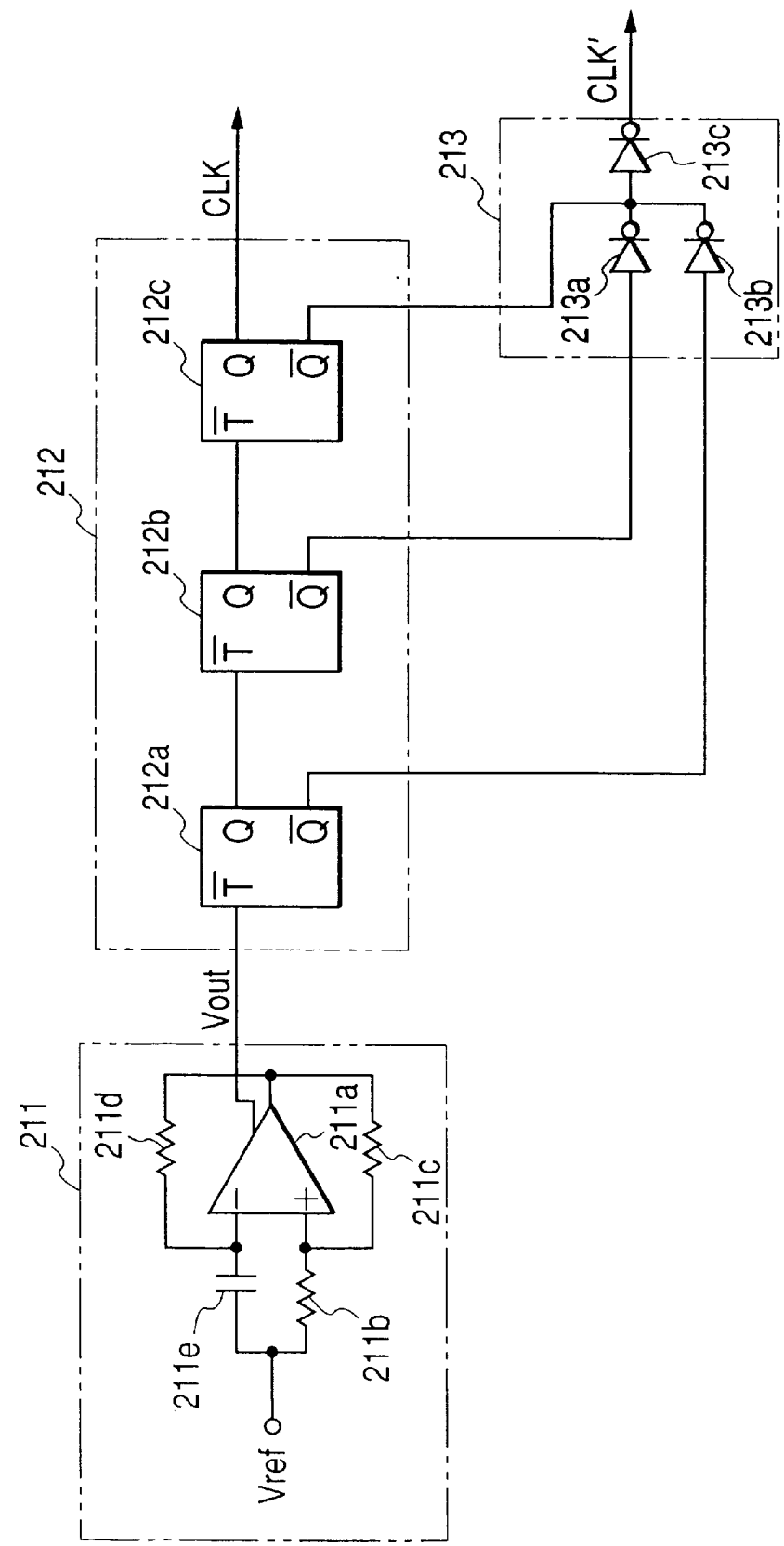
FIG. 3 is a circuit diagram which shows a clock generator.

The clock generator 21 includes, as shown in FIG. 3, an RC oscillator 211, a three-bit counter 212, and a clock generating circuit 213.

The RC oscillator 211 includes a comparator 211a, resistors 211b, 211c, and 211d, and a capacitor 211e. The resistors 211b to 211d have resistances of, for example, 16 kΩ, 4 kΩ, and 55 kΩ. The capacitor 211e has a capacitance of 25 pF. If a reference voltage Vref is 3V, the RC oscillator 211 provides, as clearly shown in FIG. 4(a), an output signal Vout at 102.4 kHz in the form of a square wave.

Figure 4:
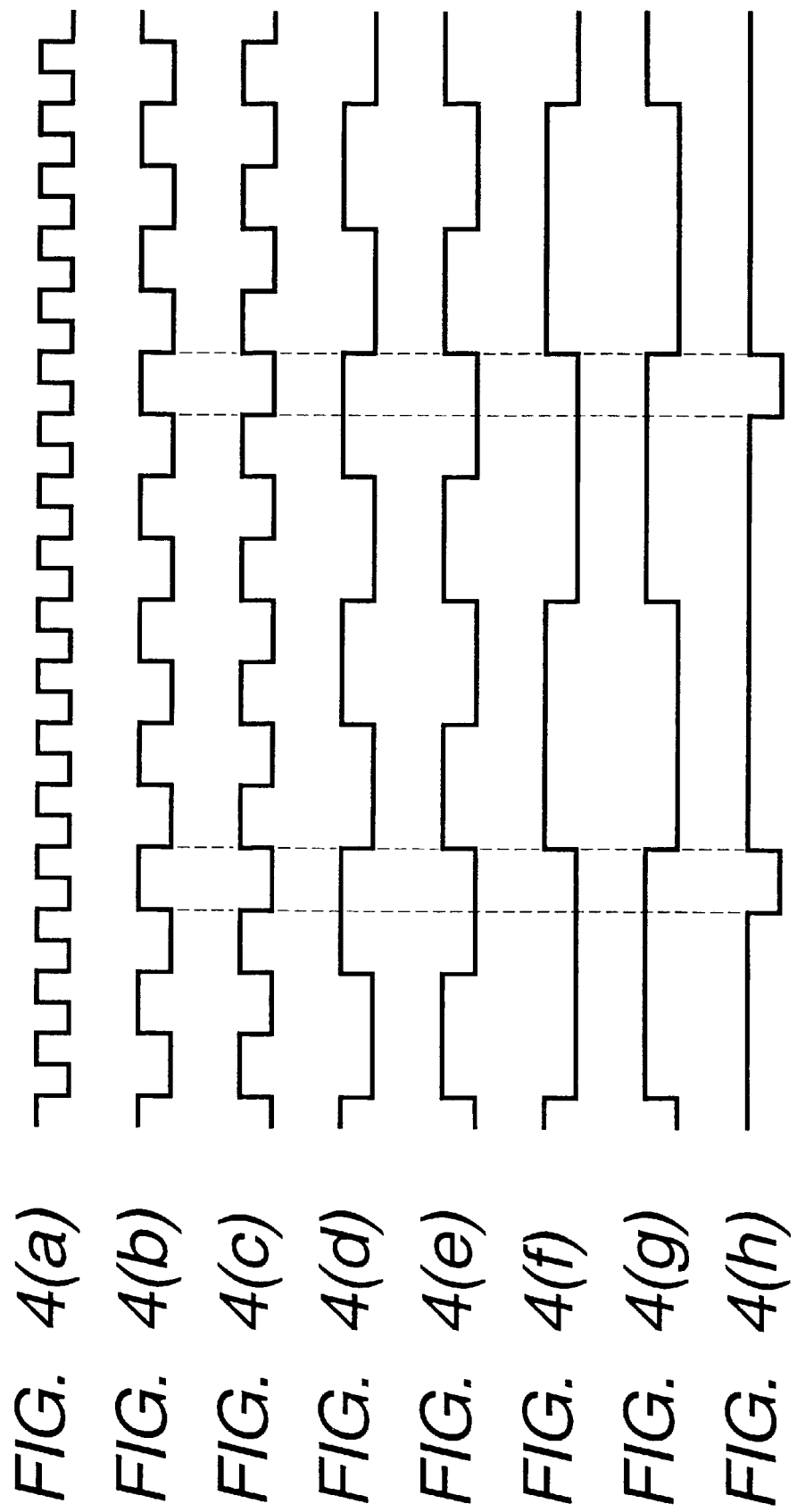
FIG. 4($a$) shows a waveform of an output of an RC oscillator 211.

The three-bit counter 212 consists of T flip-flops 212a, 212b, and 212c and counts the outputs Vout of the RC oscillator 211. Each of the T flip-flops 212a to 212c outputs a signal that is reversed in level in response to a trailing edge of an input signal. Specifically, the T flip-flop 212a outputs signals, as shown in FIGS. 4(b) and 4(c), through Q and $\overline{Q}$. The T flip-flop 212b outputs signals, as shown in FIGS. 4(d) and 4(e), through Q and $\overline{Q}$. The T flip-flop 212c outputs signals, as shown in FIGS. 4(f) and 4(g), through Q and $\overline{Q}$. The output from Q of the T flip-flop 212c is the clock pulse CLK. The T flip-flops 212a to 212c each consist of an I²L gate.

The clock generating circuit 213 consists of I²L gates 213a, 213b, and 213c and outputs the clock pulses CLK', as shown in FIG. 4(h), based on the signals, as shown in FIGS. 4(c), 4(e), and 4(g), outputted from $\overline{Q}$ of the T flip-flops 212a, 212b, and 212c. The clock pulses CLK' rise in synchronism with and fall later than the clock pulses CLK of FIG. 4(f).

Figure 5:
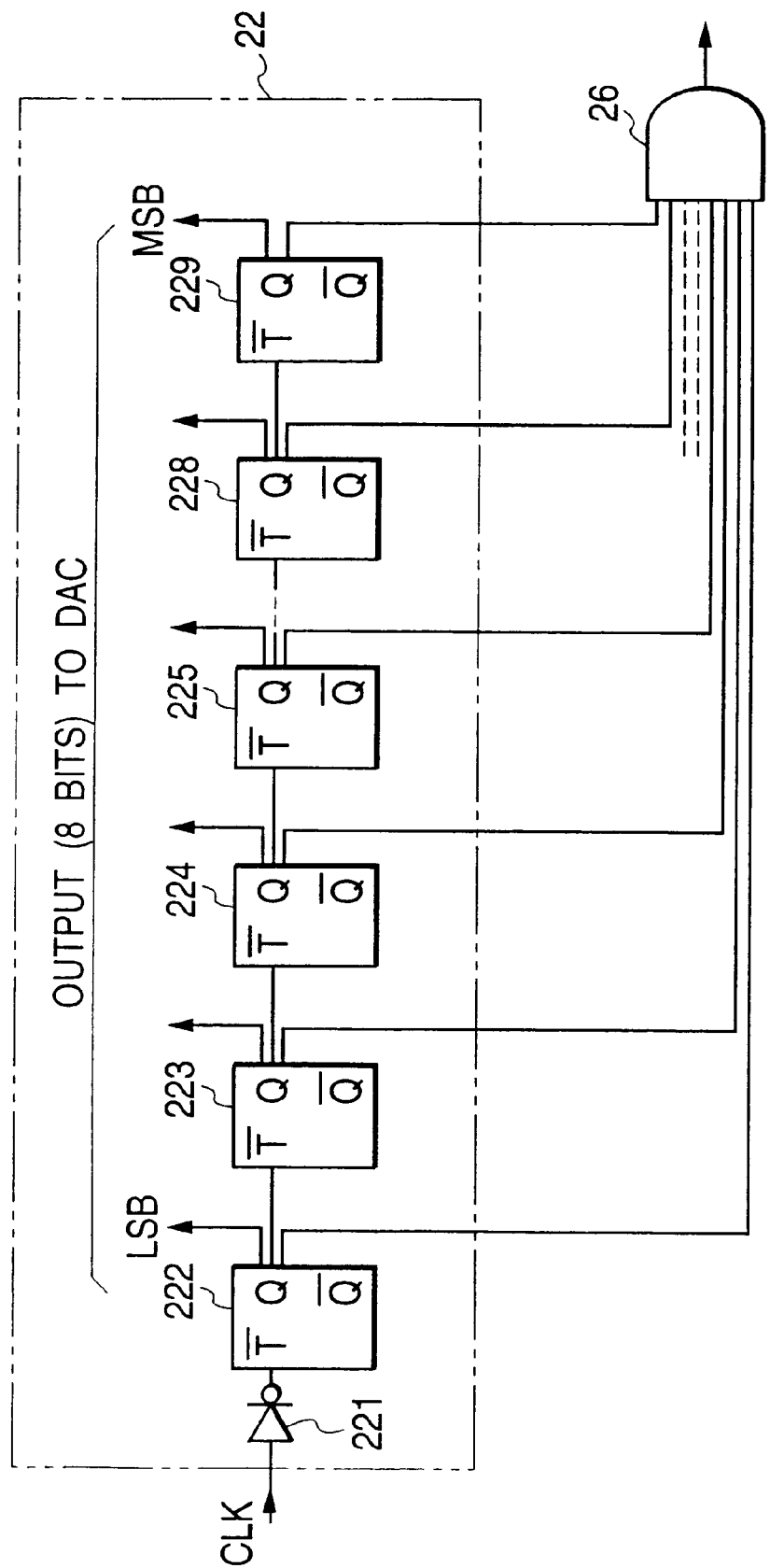
FIG. 5 is a circuit diagram which shows a counter 22.

The counter 22 includes, as shown in FIG. 5, an I²L gate 221 and eight T flip-flops 222, 223, 224, 225, • •, 228, and 229 and counts the clock pulses CLK from the clock generator 21 to output an eight-bit digital signal indicative thereof to the D/A converter 23. Each of the T flip-flops 222 to 229 produces an output that is reversed in level in response to an input signal and consists of an I²L gate. The AND gate 26 also consists of an I²L gate.

The D/A converter 23 converts the output of the counter 22 into an analog signal. Specifically, the output Vout of the RC oscillator 211 that is, as described above, the square wave signal of 102.4 kHz is counted by a total of eleven T flip-flops of the three-bit counter 212 and the counter 22 and outputted from the D/A converter 23 at 50 Hz (=102.4 Hz×10³÷2¹¹).

The outputs from Q of the T flip-flops 222 to 229 are inputted to the AND gate 26. When the outputs from Q of the T flip-flops 222 to 229 all show a logical 1, the AND gate 26 produces the set signal of high level.

The use of the counter 22 causes glitches (i.e., spikes), as shown in FIG. 2(c), to appear where the output voltage of the D/A converter changes in synchronism with reversal of level of the least significant bit LSB in the counter 22. The glitches usually result from a shift in timing with which each bit in the counter 22 changes. In practice, the output of the D/A converter 23 is changed at rising and falling of the least significant bit LSB in the counter 22, but the most significant bit MSB undergoes the greatest delay in timing with which the bits change in the counter 22, which causes the glitches to appear at the output of the D/A converter 23. FIG. 2(c) illustrates for the case where the output of the D/A converter 23 approaches the input voltage Vin of the comparator 24. The glitches cause the chattering of the output of the comparator 24, as shown in FIG. 2(d).

In this embodiment, the output of the comparator 24 is latched by controlling the clock pulses CLK' so as to fall at times shifted from the duration of the chattering of output of the comparator 24, that is, the duration of change in output of the counter 22. This eliminates the influence of noise appearing at the output of the D/A converter 23 on the PWM (pulse-width modulation).

Figure 6A:
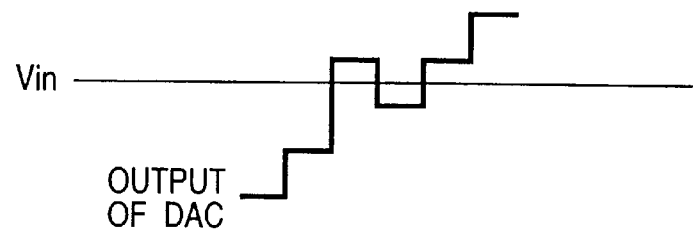
FIG. 6($a$) shows a waveform of an output of a D/A converter.
Figure 6B:

Further, the output of the D/A converter 23 has, as shown in FIG. 6(a), non-linear characteristics which may cause the chattering of output of the comparator 24, but the above latching also eliminates the influence of the chattering of output of the comparator 24 on the PWM.

The above structure allows the resistors 211b, 211c, and 211d and the capacitor 211e of the RC oscillator 211 to be set to values, as described above, which enable circuit integration, thereby allowing circuit components of the pulse-width modulator, as shown in FIG. 1, to be integrated into one chip.

Figure 7:
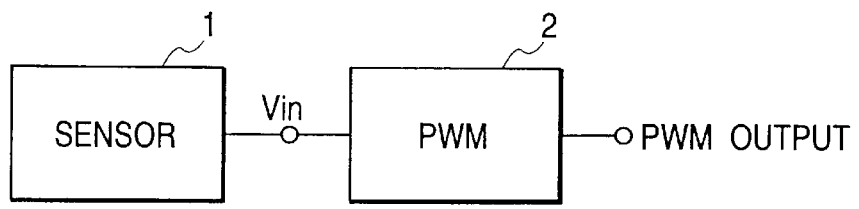
FIG. 7 is a block diagram which shows a semiconductor pressure sensor consisting of a sensing circuit and a pulse-width modulator.

FIG. 7 shows a semiconductor pressure sensor consisting of a sensing circuit 1 and a pulse-width modulator 2.

Figure 8A:
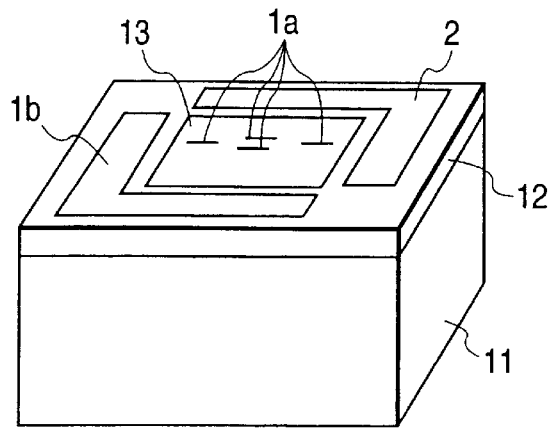
FIG. 8($a$) is a perspective view which shows a semiconductor pressure sensor.
Figure 8B:
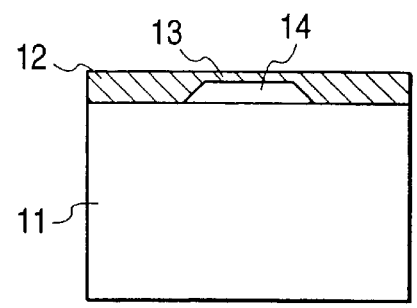

The semiconductor pressure sensor includes, as shown in FIGS. 8(a) and 8(b), a base 11 and a silicon chip 12 glued onto the base 11. The silicon chip 12 has formed thereon a diaphragm 13. Between the diaphragm 13 and the base 11, a vacuum chamber 14 is formed to measure an absolute pressure.

The silicon chip 12, as clearly shown in FIG. 8(a), has four strain gauges 1a disposed on the diaphragm 13 and a signal processing circuit 1b formed around the strain gauges 1a. The signal processing circuit 1b processes signals outputted from the strain gauges 1a. The strain gauges 1a and the signal processing circuit 1b constitute the sensing circuit 1 in FIG. 7. The pulse-width modulator 2 is disposed around the diaphragm 13.

The semiconductor pressure sensor is designed to measure the pressure within a range of an atmospheric pressure to an upper limit higher than the atmospheric pressure by P atms. An output signal of the sensing circuit 1 increases in level in proportion to an increase in pressure which is measured. If a duty cycle of the output signal of the sensing circuit 1 is 0% at the atmospheric pressure and 100% at the sum of atmospheric pressure and P atms, the output of the pulse-width modulator 2 remains at low level when the measured pressure is a negative pressure less than or equal to the atmospheric pressure and at a high level when the measured pressure is greater than the sum of atmospheric pressure and P atms. This phenomenon is difficult to distinguish from a case where the output of the pulse-width modulator 2 is kept at a constant level due to any malfunction.

Figure 9A:
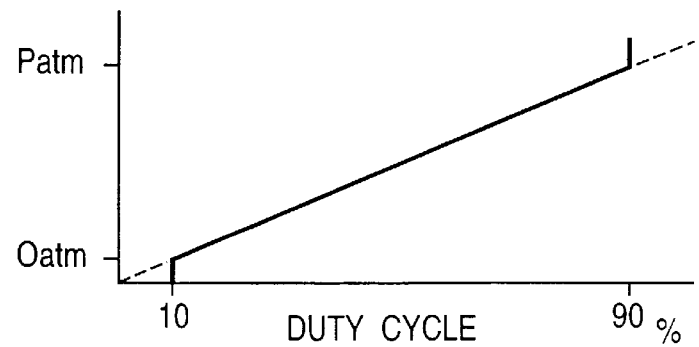
FIG. 9($a$) is a graph which shows a duty cycle of a sensor output and pressure to be measured.
FIG. 9(b) shows a waveform of a PWM signal in one cycle.
Figure 9B:
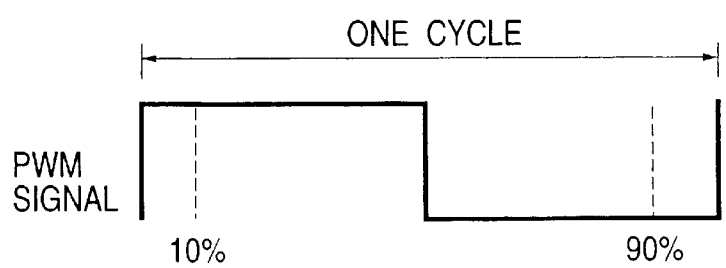

In order to avoid the above problem, the output of the sensing circuit 1 is so adjusted, as shown in FIG. 9(a), that the duty cycle may show 10% and 90% when the output of the sensing circuit 1 is at a level indicating the atmospheric pressure and at a level indicating the sum of atmospheric pressure and P atms, respectively. In this case, the output (i.e., a PWM signal) of the pulse-width modulator 2 changes in level, as shown in FIG. 9(b), between duty cycles of 10% and 90%.

Figure 10:
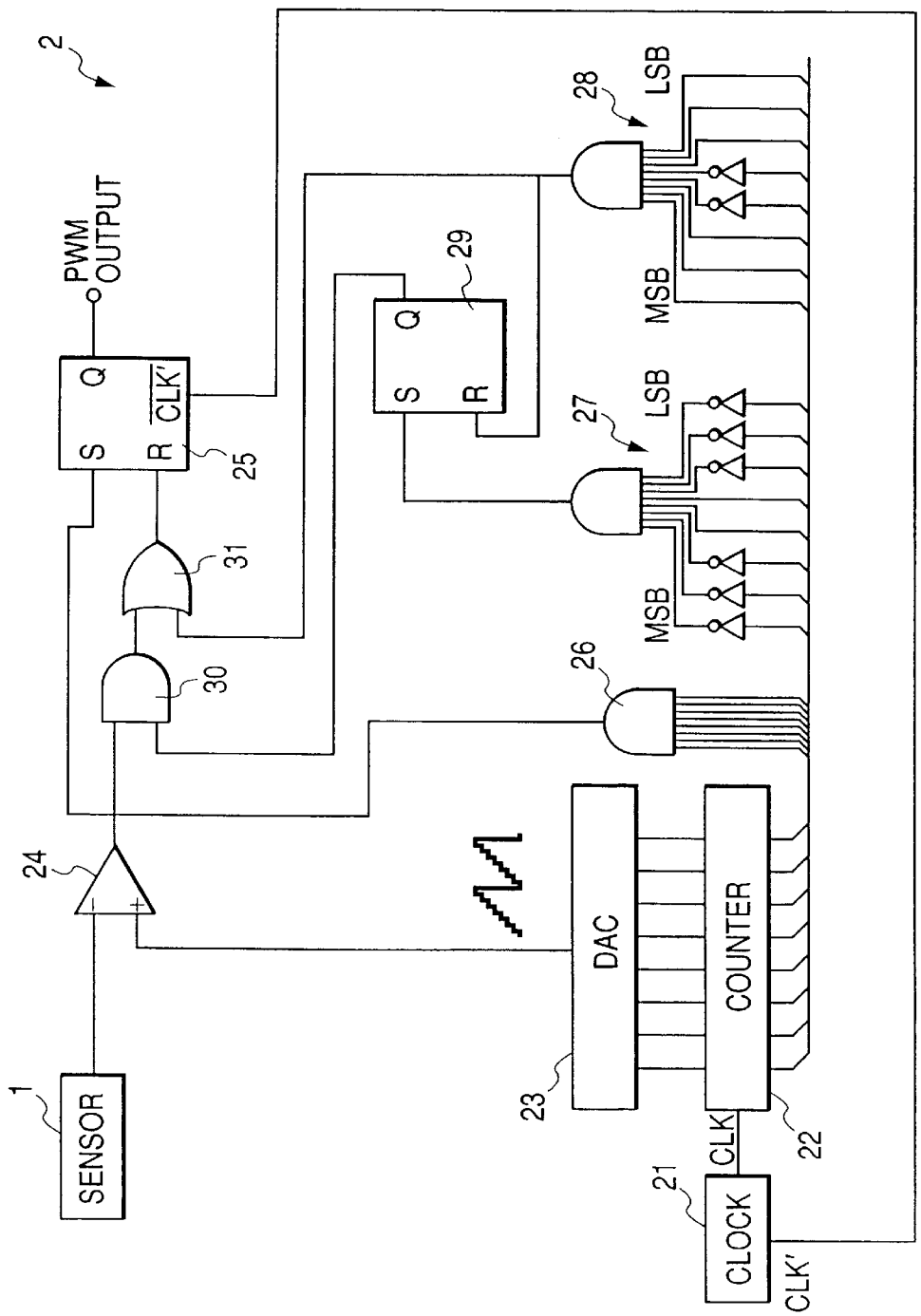
FIG. 10 is a block diagram which shows a pulse-width modulator used in the semiconductor pressure sensor of FIG. 7.

The pulse-width modulator 2 includes, as shown in FIG. 10, a first cycle detecting circuit 27, a second cycle detecting circuit 28, a flip-flop 29, an AND gate 30, and an OR gate 31 in addition to the structure of the pulse-width modulator shown in FIG. 1.

The first cycle detecting circuit 27 is designed to measure a cycle based on outputs from Q of the T flip-flops 222 to 229 of the counter 22 and sets the flip-flop 29 when the cycle reaches 10%. The AND gate 30 is opened in response to the output of the flip-flop 29, allowing the reset signal from the comparator 24 to be outputted to the RS flip-flop 25.

The second cycle detecting circuit 28 detects the instant the cycle reaches 90% based on the outputs from Q of the T flip-flops 222 to 229 of the counter 22, resets the flip-flop 29, and outputs the reset signal to the RS flip-flop 25 through the OR gate 31.

Therefore, the pulse width of the PWM signal outputted from the RS flip-flop 25 is adjusted to be within a range of a minimum to a maximum value corresponding to desired lower and upper limits of an output from the sensing circuit 1 (i.e., the atmospheric pressure and the sum of atmospheric pressure and P atms), thereby allowing the PWM signal to have a given pulse width in a normal operating condition which is different from that when the pulse-width modulator 2 is malfunctioning.

In the case where the sensing circuit 1 is made by a bipolar IC process because the clock generator 21 and the counter 22 are made up of I$^2$L gates, the pulse-width modulator 2 may be fabricated by a simple additional process. The pulse-width modulator 2 may also be made of a CMOS transistor instead of an I$^2$L gate. A typical I$^2$L gate operates on a high voltage of the order of $V_{BE}$=0.7V and a low voltage of the order of $V_{CE}$ (sat)=0.1V or less of a transistor and has a small amplitude of 0.7V, therefore, a power amplifier may be used for increasing the amplitude as needed.

The counter 22 is of an up counting type, but may alternatively be of a down counting type or an up/down counting type. The RS flip-flop 25 may be replaced with any other circuit capable of performing a latching function. The D/A converter 23 may be made of a converter of R-2R ladder type.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A pulse-width modulator comprising:

a clock generator generating clock signals;

a counter counting the clock signals outputted from said clock generator to provide a count signal indicative thereof in a digital form;

a D/A converter converting the count signal provided by said counter into an analog signal;

a comparator comparing the analog signal converted by said D/A converter with an input signal to be pulse-width modulated to provide an output indicative thereof; and a latching circuit latching the output of said comparator in response to a latch signal shifted from a change in level of the count signal outputted from said counter to provide a pulse-width modulated signal.

2. A pulse-width modulator as set forth in claim 1, wherein said clock generator includes an oscillator outputting an oscillating signal and a circuit outputting the clock signals and the latch signal based on the oscillating signal.

3. A pulse-width modulator as set forth in claim 2, wherein said latching circuit includes a flip-flop with a synchronous input which is set by a signal inputted in a given cycle and reset by latching the output of said comparator in response to the latch signal.

4. A sensing device comprising:

a sensing circuit sensing a given parameter to output a sensor signal indicative thereof;

a clock generator generating clock signals;

a counter counting the clock signals outputted from said clock generator to provide a count signal indicative thereof in a digital form;

a D/A converter converting the count signal provided by said counter into an analog signal;

a comparator comparing the analog signal converted by said D/A converter with the sensor signal outputted from said sensing circuit to provide an output indicative thereof; and a latching circuit latching the output of said comparator in response to a latch signal shifted from a change in level of the count signal outputted from said counter to provide a pulse-width modulated signal.

5. A sensing device as set forth in claim 4, wherein said sensing circuit, said clock generator, said counter, said D/A converter, said comparator, and said latching circuit are integrated into one chip.

6. A sensing device as set forth in claim 4, further comprising a circuit which adjusts a pulse width of the pulse width-modulated signal outputted from said latching circuit to be within a range of a minimum and a maximum value corresponding to a given range within which the sensor signal changes.

* * * * *